(12) United States Patent
Kuttner (10) Patent No.: US 8,228,094 B2
(45) Date of Patent: Jul. 24, 2012

(54) COMPARATOR FOR TECHNOLOGIES WITH TRANSIENT VARIATIONS OF TRANSISTOR PARAMETERS

(75) Inventor: Franz Kuttner, St. Ulrich (AT)

(73) Assignee: Infineon Technologies AG, Neubiberg (DE)

( * ) Notice: Subject to any disclaimer, the term of this patent is extended or adjusted under 35 U.S.C. 154(b) by 427 days.

(21) Appl. No.: 12/538,946

(22) Filed: Aug. 11, 2009

(65) Prior Publication Data

US 2011/0037499 A1  Feb. 17, 2011

(51) Int. Cl.
 *H03K 5/22* (2006.01)

(52) U.S. Cl. ............... 327/65; 327/64; 327/67; 327/563
(58) Field of Classification Search .............. 327/63–65, 327/67, 124, 307, 563
 See application file for complete search history.

(56) References Cited

U.S. PATENT DOCUMENTS

| 2002/0011875 A1* | 1/2002 | Shulman ........................ 327/65 |
| 2008/0224754 A1* | 9/2008 | Wei et al. ...................... 327/307 |

* cited by examiner

*Primary Examiner* — Long Nguyen
(74) *Attorney, Agent, or Firm* — SpryIP, LLC (57) ABSTRACT

This disclosure relates to permuting transistors to compensate for offsets generated by transient variations of the transistors' parameters.

21 Claims, 5 Drawing Sheets

FIG. 1

Prior Art

COMPARATOR FOR TECHNOLOGIES WITH TRANSIENT VARIATIONS OF TRANSISTOR PARAMETERS

BACKGROUND

This application relates to maintaining threshold stability when switching transistors at high frequencies, and more specifically to maintaining threshold stability of comparators having transient variations of its transistor parameters.

The physical limitations of the conventional silicon dioxide as a gate dielectric in transistors have reached the point where dioxide films thicknesses are only a few atomic layers thick. Below the physical thickness of 15 A, the gate leakage current exceeds the specifications (e.g. 1 A/cm$^2$). To overcome this critical problem, highly resistive dielectrics have been introduced into the transistor as hafnium-based, zirconium, aluminum oxides. In fact, while keeping the equivalent oxide thickness constant, highly resistant dielectrics allow increasing in the physical thickness of the transistor's gate stack. Hence gate leakage is reduced by 2 to 3 orders of magnitude. Although a large amount of effort has been invested toward highly resistive gate dielectrics, many critical problems still remain.

One of the challenges for the integration of highly resistive dielectrics is maintaining the transistors threshold voltage stability during operation. In addition to static mismatch transient variation come, transient variations of transistor parameters (e.g. $V_T$, $\mu$ . . . ) in advanced CMOS technologies are caused by effects such as charge trapping, self heating or floating body effects. These effects appear when switching electronic devices using the advance CMOS technologies at high frequencies. In addition, well known static mismatch effects can appear and can degrade the performance of mixed-signal circuits significantly.

Voltage or current comparators contain these transient variations. If the comparator is overdriven at its input, the threshold on the gate to trigger the transistor of a differential input pair is shifted asymmetrically. When one transistor of the pair of transistors receives a higher gate to source voltage than the other, a time dependent offset is introduced. If the comparator is no longer being overdriven and provides input voltages closer to its original threshold levels (the level where the threshold of the transistor pair are equal), a threshold offset voltage of several mV appears at this input stage. This offset voltage may be due to the transient variations of the transistor's parameters. This threshold offset voltage decreases with time constants in the range of μs. The accuracy of an analog to digital converter which is using such a comparator is limited to this several mV offset.

Figure 1:
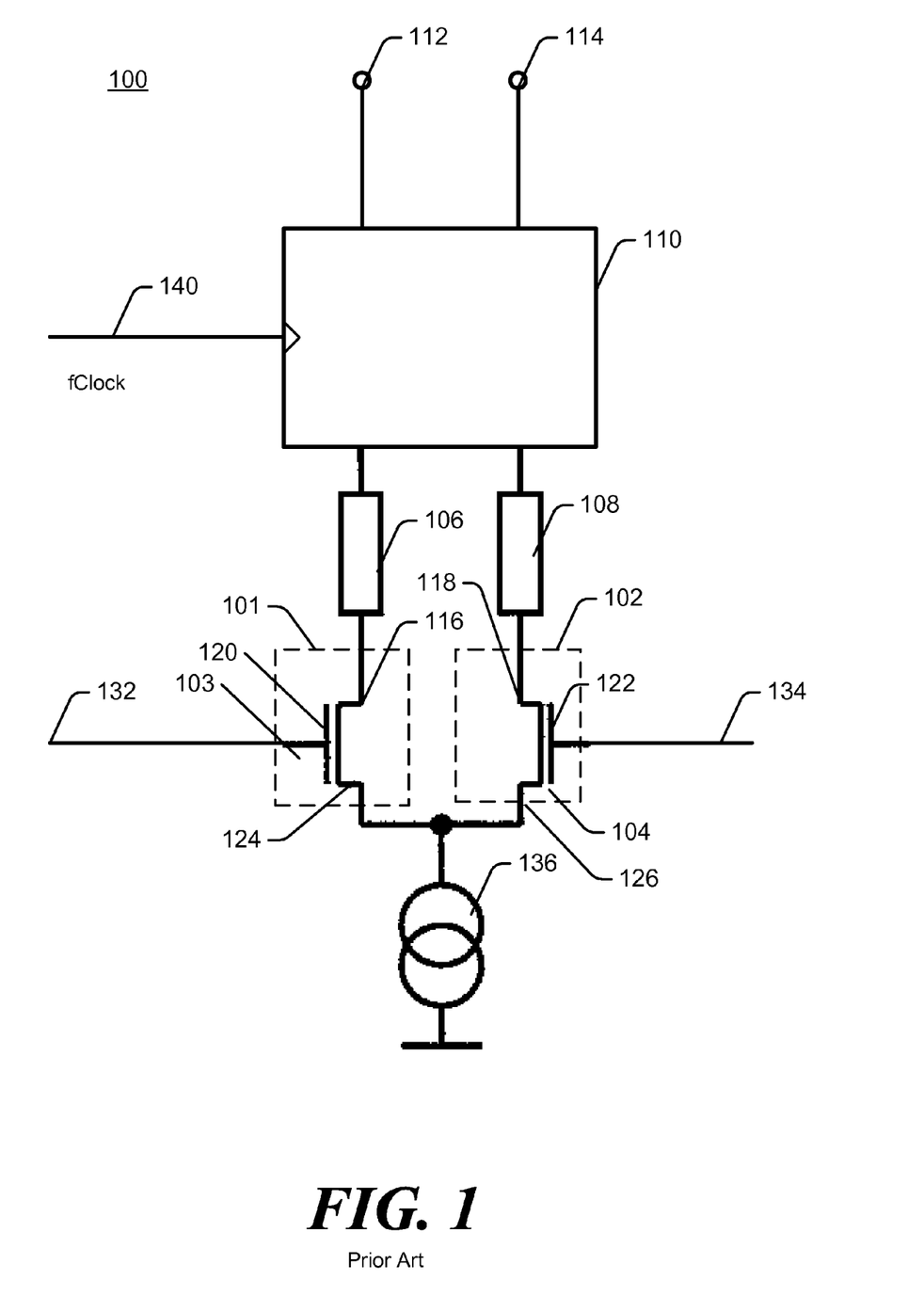
FIG. 1 is simplified schematic diagram of a prior art comparator circuit.

Shown in FIG. 1 is a comparator 100 used to detect zero voltage crossings of a signal. Comparator 100 includes comparator circuits 101 and 102. Circuits 101 and 102 include transistors 103 and 104, coupled via load 106 and 108 and via sample and hold circuit 110 to output terminals 112 and 114. Transistors 103 and 104 include source terminals 116 and 118, gate terminals 120 and 122 and drain terminals 124 and 126, respectively. Source terminals 116 and 118 are connected to load 106 and 108, respectively. Gate terminals 120 and 122 are connected to input terminals 130 and 132, and the input terminals receive a respective input signal. The drain terminals 124 and 126 are connected to current source 136. Upon receiving an input signal having a level to saturate gate terminals 120 or 122, transistors 103 and 104 respectively pass current from current source 136 via load 106 and 108 to sample and hold circuit 110. Sample and hold circuit 110 receives a clock signal (designated as "fClock") on line 140 to hold its output at fixed voltage level for the duration of an fClock period.

Normally the accuracy of the comparator is only needed near the zero voltage crossing (across the gate and drain terminal) or transistor bias level. In certain analog to digital converters, for example, the conversion is done in a successive way. First, a rough estimation of the analog voltage level which has to be converted to a digital signal is done at a first stage of a conversion cycle.

This estimation is then elaborated step by step. Only errors at the last stage of the conversion cycle affect the result. This results in a comparator which can have large errors at the beginning of the conversion cycle and no errors at the last conversion cycle. But due to the transient variations of transistor parameters caused by the overdrive at the first conversion cycle, the error only disappears at the last cycle if the conversion speed is much less than the time constant of this transient variations of transistor parameters.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

The accuracy of a comparator can be increased by using two comparator circuits. One comparator circuit takes the first rough decision by triggering when an input signal exceeds a threshold voltage of the circuit. The input to the second comparator circuit is held during this first decision in a symmetric bias point. In a subsequent cycle, the second comparator fed the estimated input signal at a level closer to the zero crossing level, and is triggered when the estimated input signal crosses the zero voltage crossing level. The error introduced by transient variations of transistor parameters at the subsequent decision cycle is small because the second comparator is fed the estimated input signal closer to the zero voltage crossing level of the comparator and sees no high overdrive.

More than two comparators can be used for this scheme. The whole comparator does not have to be built twice but only these transistors of the comparator which are stressed and which affect the comparator decision are used. These transistors have to be replicated and one of the transistors has to be held in a symmetric bias condition during the first conversion cycle. The transistors output is then used at the subsequent decision cycle.

Disclosed herein are techniques for switching transistors during the aforementioned process. Each of the input pairs of transistors in a typical comparator is replaced by at least two transistors. Due to the voltages applied to the terminals of the transistors the threshold voltage varies with time. To reduce the threshold voltage variation, the transistors are exchanged.

In one implementation, a comparator having a first and second input stage to respectively receive a first and a second input signal is described. Each stage has an input, a current source connection and an output. The input stages include a first circuit and second circuit, the first and second circuits is connected with the input stage's input, output and current source connection. The second circuit selectively disconnects from the first input stage's output and connects to the second stage's output. The second circuit selectively disconnects from the first input stage's input and connects to the second stage's input. The output stage generates a signal corresponding to a level of a signal on one of the output thus improving the accuracy of the comparator.

According to another implementation, a method is provided for receiving with a circuit, that includes a first and a second input stage, and a first and a second input signal. The first input signal is received with a first and a second circuit disposed in the first input stage. The second input signal is received with a third and a fourth circuit disposed in the second input stage. In response to the first input signal, a first output signal generated by the first circuit and a second output signal generated by the second circuit is fed to a first output terminal. In response to the second input signal, a third output signal generated by the third circuit and fourth output signal generated by the fourth circuit is fed to a second output terminal. The second output signal generated by the second circuit is periodically fed to the second output and the fourth output signal generated by the fourth circuit is fed to the first output. The second output signal from the second output terminal is periodically removed and the second output signal is fed to the first output. The fourth output signal is periodically removed from the first output and the fourth output signal is fed to the second output.

The techniques described herein may be implemented in a number of ways. One example environment and context is provided below with reference to the included figures and on going discussion.

Exemplary Systems

Figure 2:
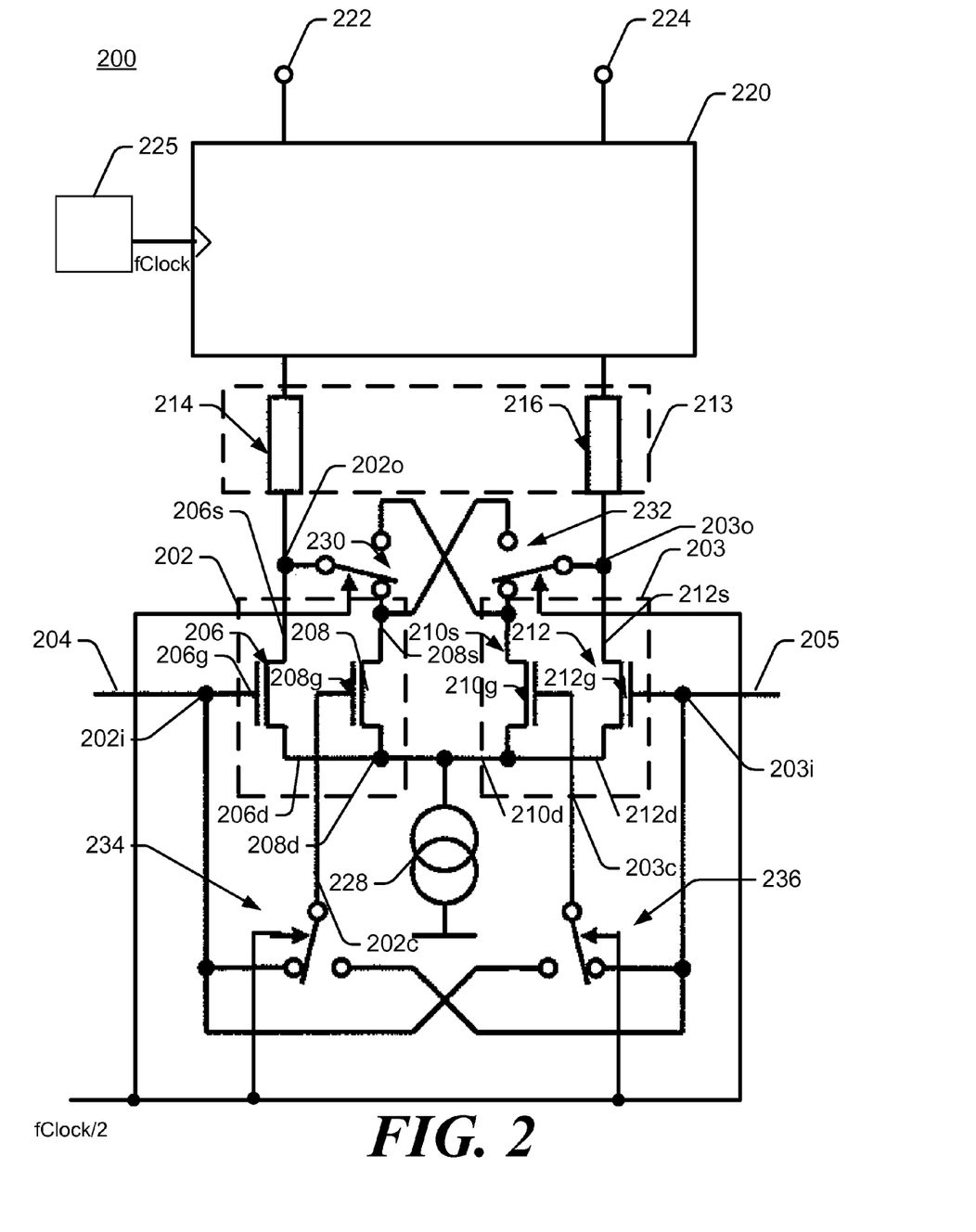
FIG. 2 is simplified schematic diagram of a comparator circuit incorporating a permuting circuit.

FIG. 2 illustrates one implementation of the comparator circuit 200 that includes input stages 202 and 203. Input stage 202 has an input terminal 202i, an output terminal 202o and a current source connection 202c. Input stage 203 has an input terminal 203i, an output terminal 203o and a current source connection 203c. The inputs of input stages 202 and 203 are respectively connected to input terminals 204 and 205. Input stage 202 includes transistors 206 and 208, and input stage 203 includes transistors 210 and 212. The outputs of input stages 202 and 203 are coupled via load 213 and sample and hold circuit 220 to output terminals 222 and 224 respectively. Sample and hold circuit 220 receives a clock signal (designated as "fClock") generated by clock generation circuit 225. The output of the Sample-and-hold circuit 220 is maintained at fixed level for the duration of at least on fClock period.

Load 213 includes load stages or load circuits 214 and 216, which respectively connect input stages 202 and 203 to sample and hold circuit 220.

Transistors 206-212 include source terminals 206s-212s, gate terminals 206g-212g and drain terminals 206d-212d respectively. Source terminal 206s is connected to load 214, and source terminals 208s and 210s are selectively connected to load 214. Source terminal 212s is connected to load stage 216, and source terminals 208s and 210s are selectively connected to load stage 216. Gate terminal 206g is connected to input terminal 204, and gate terminals 208g and 210g are selectively connected to input terminal 204. Gate terminal 212g is connected to input terminal 205, and gate terminals 208g and 210g are selectively connected to input terminal 205. Input terminals 204 and 205 receive input signals. The drain terminals 206d-212d are connected via the current source connection of the input stages 202 and 203 to current source 228.

Switches 230 and 232 respectively connect to source terminal 206s and source terminal 212s. Switch 230, in response to an fClock/2 signal, selectively connects source terminal 206s to either source terminal 208s or source terminal 210s. Switch 232 selectively connects source terminal 212s to either source terminal 208s or source terminal 210s. Switches 234 and 236 are connected to drain terminal 206d, drain terminal 208d and drain terminal 210d. Switch 234 selectively connects drain terminal 206d to either drain terminal 208d or drain terminal 210d. Switch 236 selectively connects drain terminal 212d to either drain terminal 208d or drain terminal 210d. The clock fClock/2 signal is fed to switches 230-236. In one implementation, fClock/2 is generated by circuit 225 and is synchronized with, and has a frequency that is half of, the frequency of the fClock. Further switches 230-236 respond to the clock signal by connecting and removing one terminal to another terminal as the level of the fClock/2 clock signal changes.

In operation, one of input stages 202 or 203 is stressed by the input voltage level of its input signal while the other of input stages 203 or 202 is not. For example, the input voltage level of the input signal provided on input terminal 204 overdrives input stage 202, while the input signal provided on input terminal 205 does not overdrive input stage 203. During a first fClock clock cycle, due to this overdrive resulting from the input signal, the threshold voltage of the gate terminals 206g and 208g of input stage 202 rises, whereas the threshold voltage of the gate terminals 210g and 212g of input stage 203 declines. On a subsequent fClock clock cycle, switches 230-236 are switched resulting in transistor 208 on input stage 202 being exchanged with transistor 210 of stage 203 to restores the symmetry in the circuit. Thus, the offset generated by the transient variations of transistor parameters is compensated by permuting the comparators' transistors. In one implementation, all the switches 230-236 switch simultaneously in response to the fClock/2 signal.

Figure 3:
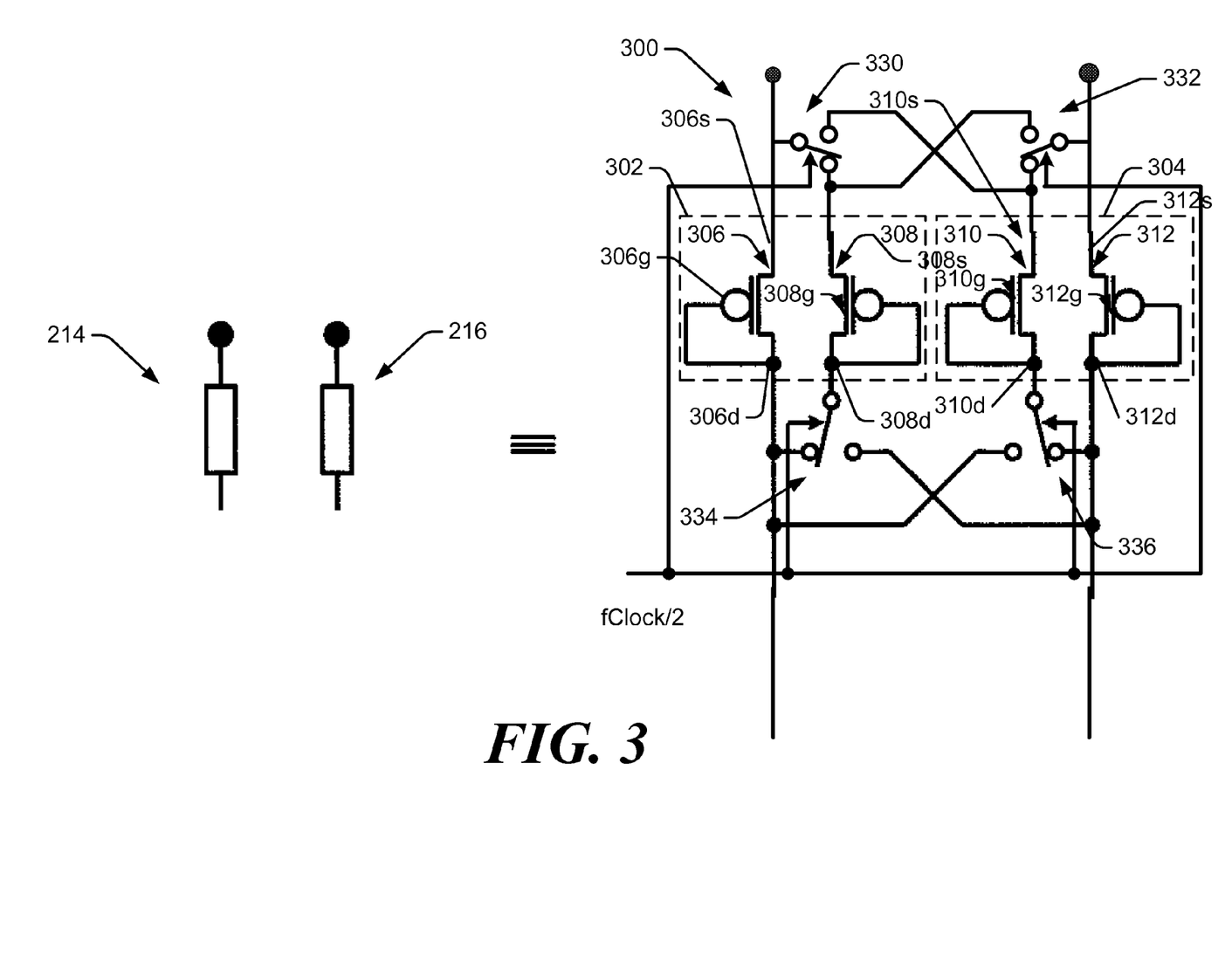
FIG. 3 is simplified schematic diagram of a load circuit shown in FIG. 2.

FIG. 3 shows the load 213 depicted in FIG. 2. Load 213 includes load circuit 300 comprising load circuit 302 and load circuit 304. Load circuit 302 includes transistors 306-308, and load circuit 304 includes transistors 310-312. Transistors 306-312 include source terminals 306s-312s, gate terminals 306g-312g and drain terminals 306d-312d, respectively. Source terminal 306s is connected via sample and hold circuit 220 to output terminal 222, and source terminals 308s and 310s are selectively connected via sample and hold circuit 220 to output terminal 222. Source terminal 312s is connected via sample and hold circuit 220 to output terminal 224, and source terminals 308s and 310s are selectively connected via sample and hold circuit 220 to output terminal 224. Gate terminals 306g-312g are respectively connected to drain terminals 306d-312d and the output of input stages 202 and 203 (FIG. 2).

Switch 330 is connected to source terminal 306s source terminal 308s and source terminal 310s. Switch 332 is connected to source terminal 308s, source terminal 310s, and source terminal 312s. Switch 330 selectively connects source terminal 306s to either source terminal 308s or source terminal 310s. Switch 332 selectively connects source terminal 312s to either source terminal 308s or source terminal 310s. Switch 334 selectively connects drain terminal 306d to either drain terminal 308d and to drain terminal 310d. Switch 336 selectively connects drain terminal 306d to either drain terminal 308d or to drain terminal 310d. Clock signal fClock/2 is fed to switches 330-336. In one implementation, switches 330-336 respond to the clock signal fClock/2 by switching from one terminal to another in response to the voltage level of the clock signal changing.

In operation, one load circuit 302 is fed the output signal of input stage 202 while the other load circuit 303 is not. For example, the input voltage level of the output signal from stage 202 is provided on input terminal 304 and drives load circuit 302, while the output signal from stage 203 drives load circuit 304. During a first fClock clock cycle, the threshold voltage of the gate terminals 306g and 308g in load circuit 302 rises, whereas the threshold voltage of the gate terminals 310g and 312g of load circuit 304 declines. On a all subsequent fClock clock cycles, switches 330-336 are switched resulting in transistor 308 on load circuit 302 being exchanged with transistor 310 of 303 to restore the symmetry in the load circuit.

Figure 4:
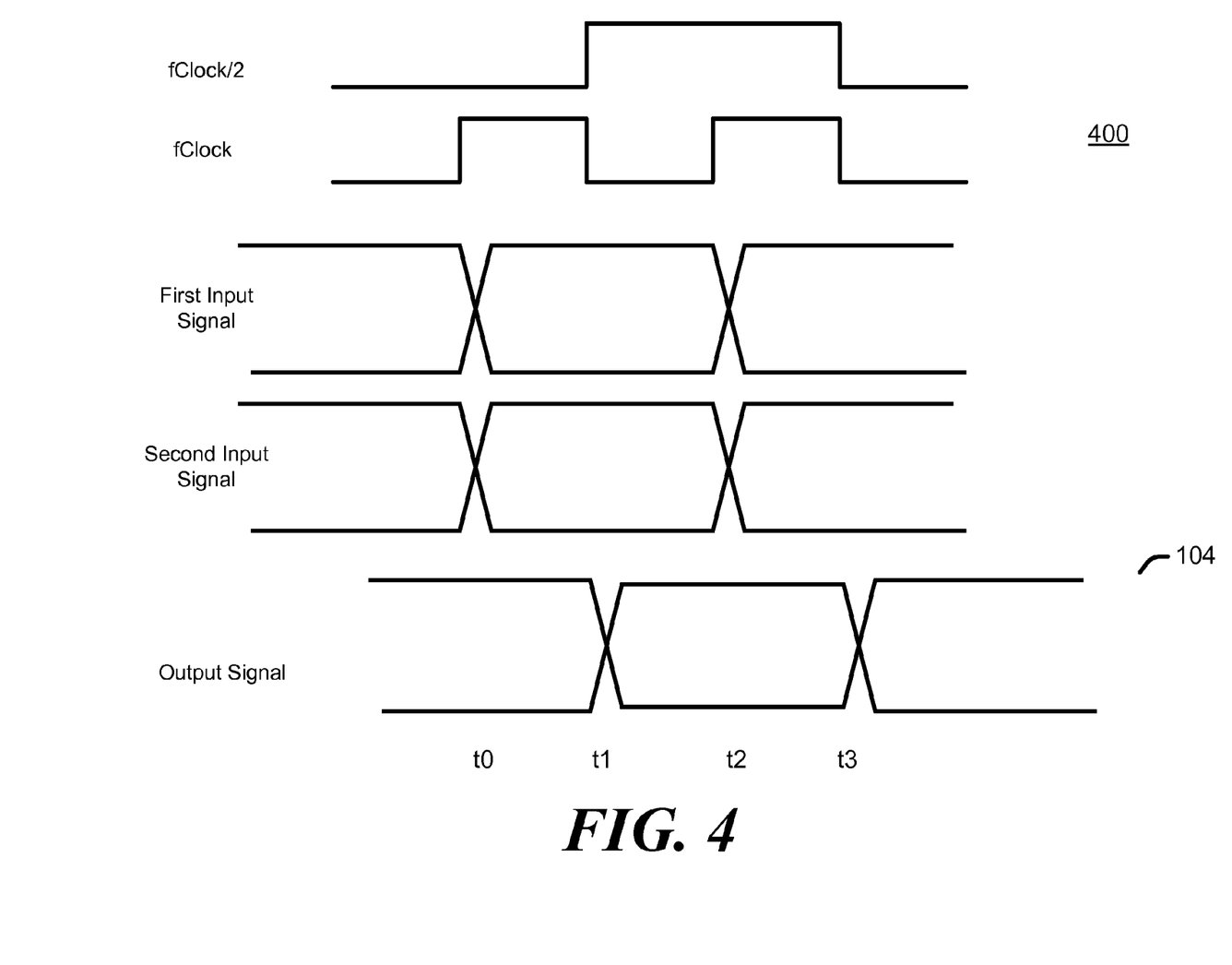
FIG. 4 is a timing diagram to permute the comparator circuit in accordance with the invention.

FIG. 4 shows a timing diagram for the circuit depicted in FIG. 2. The timing diagram illustrates the relationship over time between the first and second input signals respectively fed to input terminals 204 and 205, and the output signals on output terminal 222 and 224 in response to the fClock and fClock/2. Prior to time t0, input signals are provided to the first stage 202 and second stage 203 via input terminals 204 and 205. The fClock and fClock/2 signals are fed to the sample and hold circuit 220 and switches 230-236. In response to the fClock signal, switches 230-236 change their terminal's connection. The input signals on terminals 204 and 205 are respectively fed via stages 202 and 203, and load 213 to the input of sample and hold circuit 220. At time t1, in response to the fClock signal, switches 230-236 switch their terminals. In response to fClock/2 the input signal on the input terminals of sample and hold circuit 220 is propagated to the output terminals as the output signal. Subsequently at time t2, in response to the fClock signal, the switches 230-236 switch from one terminal to another. The input signal is again propagated via stages 202 and 203, and load 213 to the input of sample and hold circuit 220. At time t3, in response to the negative edge of fClock/2, the input of the sample and hold circuit 220 is propagated to the output terminals 222 and 224 as the output signal.

This scheme of exchanging stressed devices can be used with every symmetrical circuit. If for example the load resistors are built by transistors, the transient variations of these transistor parameters can be compensated in the same way.

Although the two stages are shown as one example, this implementation is meant to serve only as a non-limiting example and multiple stages may be used having multiple transistors.

Exemplary Process

Figure 5:
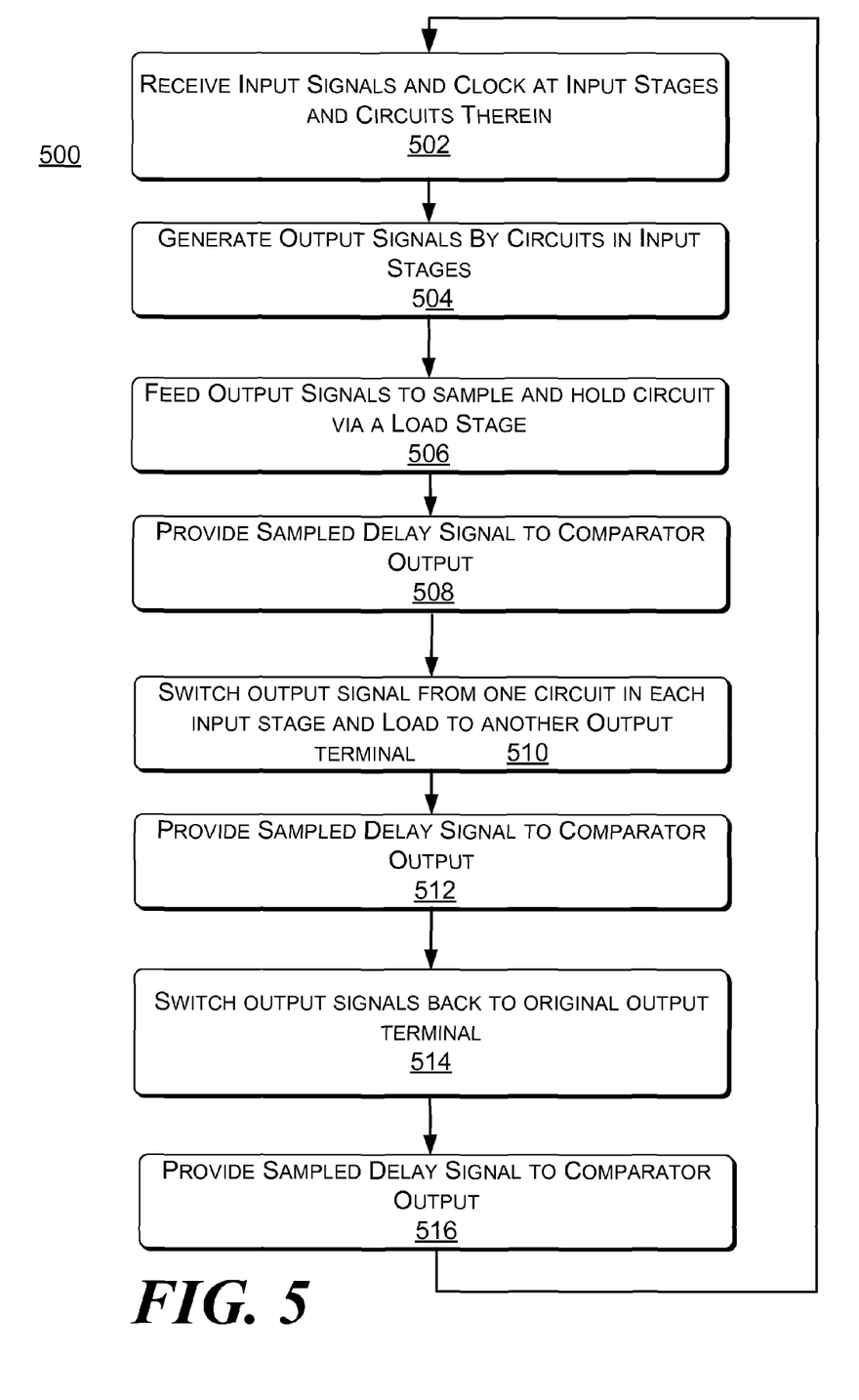
FIG. 5 is a flow diagram of an exemplary process for permuting the comparator circuit in accordance with the invention.

FIG. 5 shows one example implementation of a process 500 for using a comparator to handle transient variations of transistor parameters. The system in FIG. 2 may be used for reference in describing one aspect of providing a comparator circuit 200 including switches permuting input stage 202 and input stage 203.

At block 502, the input signals, i.e., the fClock/2 and fClock signal, are received at the input stages. The switches and the transistor circuits are disposed within the input stages.

At block 504, the transistors in the input stages 202 and 203 generate output signals. The output signal varies as a function of the threshold voltage level between the gate and the drain in the transistors 206-212.

At block 506, the output signals are fed to the sample and hold circuit 220 via the load 213.

At block 508, the output signals fed to the to the sample and hold circuit 220 are sampled by the sample and hold circuit 220 and held for one fClock cycle before being fed to the comparator's output terminals 222 and 224.

At block 510, in response to the fClock/2 signal, an output signal from one circuit in input stages 202 and 203 and the load stages 214 and 216 is switched and fed to another output terminal of another one of input stages 202 and 203. The switched output signals are fed via the load 213 to the sample and hold circuit 220.

At block 512, the switched output signals fed to the to the sample and hold circuit 220 are sampled by the sample and hold circuit 220 and are held for one fClock cycle before being fed to the comparator's output.

At block 514, in response to the fClock/2 signal, the output signal from one circuit in the input stages 202 and 203 and load stage 213 is switched back and fed to the original output of the input stage.

At block 516, the switched output signals fed to and sampled by the sample and hold circuit 220 and are held for one fClock cycle before being fed to output terminals 222 and 224. This process then begins again at block 502, where the input signals, the fClock/2 and fClock signal are received at the input stages 202 and 203.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
   a first and second input stage to respectively receive a first input signal and a second input signal, each stage having an input terminal, a current source connection and an output terminal;
   the first and second input stages each including a first circuit and second circuit, the first and second circuits in the first input stage being coupled with the input terminal, output terminal and current source connection of the first input stage, the first and second circuits in the second input stage being coupled with the input terminal, output terminal and current source connection of the second input stage, wherein the second circuit of the first input stage is operative to selectively disconnect from the output terminal of the first input stage and connect to the output terminal of the second input stage, and wherein the second circuit of the first input stage is operative to selectively disconnect from the input terminal of the first input stage and connect to the input terminal of the second input stage;
   an output stage to sample and hold a signal corresponding to a level of a signal on one of the outputs terminals.

2. A system as recited in claim 1, further comprising a circuit for generating a clock signal; wherein the second circuit of the second input stage is operative to selectively disconnect from the second input stage's output terminal and connect to the first stage's output terminal in response to the clock signal.

3. A system as recited in claim 1, wherein the first and the second circuits of the first and second input stages each comprise a transistor having a gate, a source and a drain.

4. A system as recited in claim 3, wherein the first input signal is received by the gate of the transistor.

5. A system as recited in claim 3, wherein the drain in one of the first and second input stages is connected to the current source.

6. A system as recited in claim 5, wherein the source in one of the first and second input stages is selectively connected to and disconnected from input stage's output terminal.

7. A system as recited in claim 2, wherein the first stage and second stage are connected to their respective output terminals via a first load stage and a second load stage respectively, wherein the first and second load stages include a third circuit and a fourth circuit; wherein the third circuit is operative to selectively disconnect from the first stage's output terminal and connect to the second stage's output terminal, wherein the fourth circuit is operative to selectively disconnect from the second stage's output terminal and connect to the first stage's output terminal.

8. A system as recited in claim 7, wherein the fourth circuit is operative to selectively disconnect from the output terminal of the second stage and connect to the output terminal of the first stage's when the third circuit disconnects from the first stage output terminal, wherein the fourth circuit is operative to selectively disconnect from the first stage's output terminal and connect to the second stage's output terminal when the third circuit disconnects from output terminal of the second stage.

9. In a comparator circuit, a device comprising:
   a first input stage including:
      an input terminal,
      a current source connection,
      an output terminal, and
      a first and second transistor, said first and second transistor each including:
         a source terminal coupled with the output terminal,
         a gate terminal coupled with the input terminal, and
         a drain terminal coupled with the current source terminal;
   a second input stage including:
      an input terminal,
      a current source connection, and
      an output terminal, and
      a third and fourth transistor, said third and fourth transistor including:
         a source terminal coupled with the second stage output terminal,
         a gate terminal coupled with the input terminal of the second stage, and
         a drain terminal coupled with the current source connection of the second stage; and
   the second transistor to be selectively disconnected from the output terminal of the first input stage and be connected to the output terminal of the second input stage, and to be selectively disconnected from the input terminal of the first input stage and to be connected to the input terminal of the second input stage.

10. A circuit as recited in claim 9, further comprising:
   a circuit for generating a clock signal; and
   a switch to selectively disconnect the second transistor from the output terminal of the second input stage and connect the second transistor to the output terminal of the first input stage in response to the clock signal.

11. A circuit as recited in claim 10, wherein the first input signal is received by the gate terminal of the second transistor in the first input stage.

12. A circuit as recited in claim 10, wherein the first input stage is connected to the first input stage output terminal via a first load stage, wherein the second input stage is connected to the second input stage output terminal via a second load stage, wherein the first and second load stages each include a third circuit and a fourth circuit; wherein in response to the clock signal, the third circuit selectively disconnects from the output terminal of the first input stage and connect to the output terminal of the second input stage, wherein the third circuit is operative to selectively disconnect from the output terminal of the second input stage and connect to the output terminal of the first input stage.

13. A circuit as recited in claim 12, wherein the fourth circuit is operative to selectively disconnect from an output terminal of the second input stage and connect to the output terminal of the first input stage when the third circuit disconnects from the first input stage output, wherein the fourth circuit is operative to selectively disconnect from the output terminal of the first input stage and connect to the output terminal of the second input stage when the third circuit disconnects from the output terminal of the second input stage.

14. A method comprising:
   receiving a first input signal with a first and a second circuit disposed in a first input stage;
   receiving a second input signal with a third and a fourth circuit disposed in a second input stage;
   in response to the first input signal, feeding a first output signal generated by the first circuit and a second output signal generated by the second circuit to a first output terminal;
   in response to the second input signal, feeding a third output signal generated by the third circuit and a fourth output signal generated by the fourth circuit to a second output terminal;
   periodically feeding the second output signal generated by the second circuit to the second output terminal and periodically feeding the fourth output signal generated by the fourth circuit to the first output terminal; and
   periodically removing the second output signal from the second output terminal and feeding the second output signal to the first output terminal, and periodically removing the fourth output signal from the first output terminal feeding the fourth output signal to the second output terminal.

15. A method as recited in claim 14, further comprising supplying a clock signal to the second circuit and the fourth circuit; and wherein, in response to the clock signal, the second output signal is fed to the second output terminal and the fourth output signal is fed to the first output terminal, the second output signal is removed from the second output terminal and fed to the first output terminal, and the fourth output signal is removed from the first output terminal is fed to the second output terminal.

16. A method as recited in claim 15, wherein the first and second circuit each comprises a transistor having a gate terminal, a source terminal and a drain terminal.

17. A method as recited in claim 16, wherein the first input signal is received by the gate terminal of the transistor of the first circuit and by the gate terminal of the transistor of the second circuit.

18. A method as recited in claim 16, wherein the drain terminal of the first circuit and the drain terminal of the second circuit are connected to a current source.

19. A method as recited in claim 15, wherein the source terminal of the second terminal is selectively connected to and the output terminal in response to the clock signal.

20. A method as recited in claim 15 further comprising holding a voltage level of the first or second output signal for a predetermined time period in response to the clock signal.

21. A method comprising:
providing two pairs of transistors, where each pair has a common output terminal, input terminal and current source terminal; and
permuting a transistor in one of the pairs of transistors with a transistor in the other of the pair of transistors to compensate for offset generated by transient variations of the transistors parameters.

* * * * *